United States Patent
Liao et al.

(10) Patent No.: US 7,909,617 B2
(45) Date of Patent: Mar. 22, 2011

(54) ELECTRICAL CONNECTOR HAVING CONTACT ALIGNED IN PREDETERMINED ARRANGEMENT

(75) Inventors: Fang-Jun Liao, Tu-cheng (TW); Ming-Lun Szu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/460,414

(22) Filed: Jul. 16, 2009

(65) Prior Publication Data
US 2009/0280660 A1 Nov. 12, 2009

Related U.S. Application Data

(63) Continuation of application No. 12/152,181, filed on May 13, 2008, now Pat. No. 7,563,107, which is a continuation of application No. 10/894,735, filed on Jul. 19, 2004, now Pat. No. 7,371,075.

(51) Int. Cl.
*H01R 12/00* (2006.01)
(52) U.S. Cl. .................................... 439/71
(58) Field of Classification Search ............ 439/66, 439/68–71, 266, 330, 342, 525, 885, 526, 439/527, 64, 259, 331, 263–265
See application file for complete search history.

(56) References Cited

U.S. PATENT DOCUMENTS

| | | | |
|---|---|---|---|
| 4,504,105 A | 3/1985 | Barkus et al. | |
| 4,621,884 A | 11/1986 | Berkebile, Jr. et al. | |
| 4,692,790 A | 9/1987 | Oyamada | |
| 5,302,853 A | 4/1994 | Volz et al. | |
| 5,344,334 A | 9/1994 | Laub et al. | |
| 6,146,151 A * | 11/2000 | Li | 439/66 |
| 6,176,707 B1 * | 1/2001 | Neidich et al. | 439/66 |
| 6,196,852 B1 * | 3/2001 | Neumann et al. | 439/66 |
| 6,447,318 B1 * | 9/2002 | Okamoto | 439/266 |

* cited by examiner

*Primary Examiner* — Edwin A. Leon
(74) *Attorney, Agent, or Firm* — Andrew C. Cheng; Wei Te Chung; Ming Chieh Chang (57) ABSTRACT

An electrical connector (1) for connecting a land grid array (LGA) chip with a printed circuit board (PCB) includes a housing (10), and terminals (11) received in passageways (104) of the housing. The housing has a base (100) and sidewalls (12, 14), the base and the sidewalls cooperatively defining a space therebetween for retaining the LGA chip. The base has a multiplicity of walls respectively between every two adjacent passageways along a length thereof, and four raised portions (102) extending upwardly around the base. A multiplicity of protrusions (106) is respectively extended upwardly from the walls. When a force is exerted down the LGA chip to make the LGA chip engage with the terminals, the protrusions and the four raised portions can support the force for separate the force without making the LGA chip deforming downwardly. This ensures that engagement between the connector and the LGA chip is accurate and reliable.

13 Claims, 9 Drawing Sheets

ELECTRICAL CONNECTOR HAVING CONTACT ALIGNED IN PREDETERMINED ARRANGEMENT

This is a continuation of the application Ser. No. 12/152,181 filed May 13, 2008, now U.S. Pat. No. 7,563,107, which is a continuation of the application Ser. No. 10/894,735 filed Jul. 19, 2004, now U.S. Pat. No. 7,371,075.

BACKGROUND OF THE INVENTION

1. Field of the Invention

The present invention relates to an electrical connector for electrically connecting an electronic package such as a land grid array (LGA) chip with a circuit substrate such as a printed circuit board (PCB), and particularly to a connector having protrusions that minimize the risk of accidental damage to the associated electronic package.

2. Description of the Prior Art

Land grid array (LGA) electrical connectors are widely used in the connector industry for electrically connecting LGA chips to printed circuit boards (PCBs) in personal computers (PCs). As described in "Nonlinear Analysis Helps Design LGA Connectors" (Connector Specifier, February 2001, pp. 18-20), the LGA connector mainly comprises an insulative housing and a multiplicity of terminals. The housing comprises a multiplicity of terminal passageways defined therein in a generally rectangular array for interferentially receiving corresponding terminals. Due to the very high density of the terminal array in a typical LGA chip, the LGA chip need to be precisely seated on the LGA connector to ensure reliable signal transmission between the terminals and the LGA chip. Means for accurately attaching the LGA chip to the LGA connector are disclosed in U.S. Pat. Nos. 4,504,105, 4,621,884, 4,692,790, 5,302,853 and 5,344,334.

Figure 8:
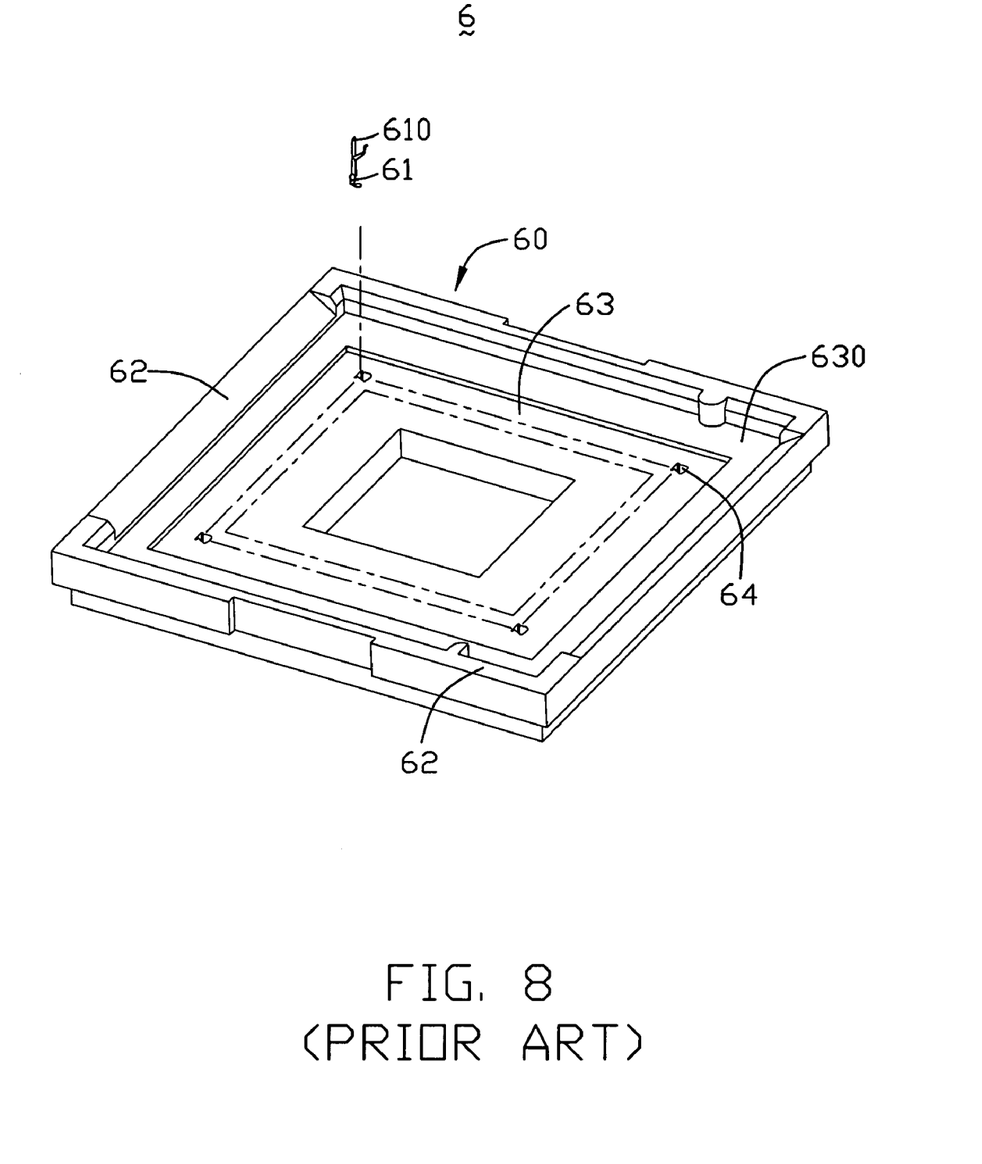
FIG. 8 is a simplified, exploded isometric view of a conventional LGA electrical connector.

Referring to FIG. 8, a conventional connector 6 comprises an insulative housing 60 and a multiplicity of terminals 61 received therein. In forming the connector 6, a carrier strip (not shown) comprises a row of the terminals 61, and a row of connecting sections 610 respectively connecting the terminals 61 with a main body of the carrier strip. The housing 60 comprises four raised sidewalls 62, and a flat base 63 disposed between the four raised sidewalls 62. Four raised portions 630 are disposed upwardly around the flat base 63. Two opposite of the sides 62 each have a sloped surface that slants down toward the raised portion 630. The base 63 and the sidewalls 62 cooperatively define a space therebetween for receiving an LGA chip (not shown) therein. The base 63 defines a multiplicity of terminal passageways 64 for receiving the terminals 61 therein. When the LGA chip is seated on the LGA connector 6, the four raised portions 630 and the four sidewalls 62 can securely engage the LGA chip thereon and therebetween. The sloped surfaces provide additional space to manipulate a carrier strip to allow easy cutting off of connecting sections 610 from their corresponding terminals 61. However, the sloped surfaces diminish the original advantage of the sides 62 being raised. That is, a reduced surface area of the sides 62 is available to retain the LGA chip therebetween. This can adversely affect the reliability of signal transmission between the terminals 61 and the LGA chip.

Figure 9:
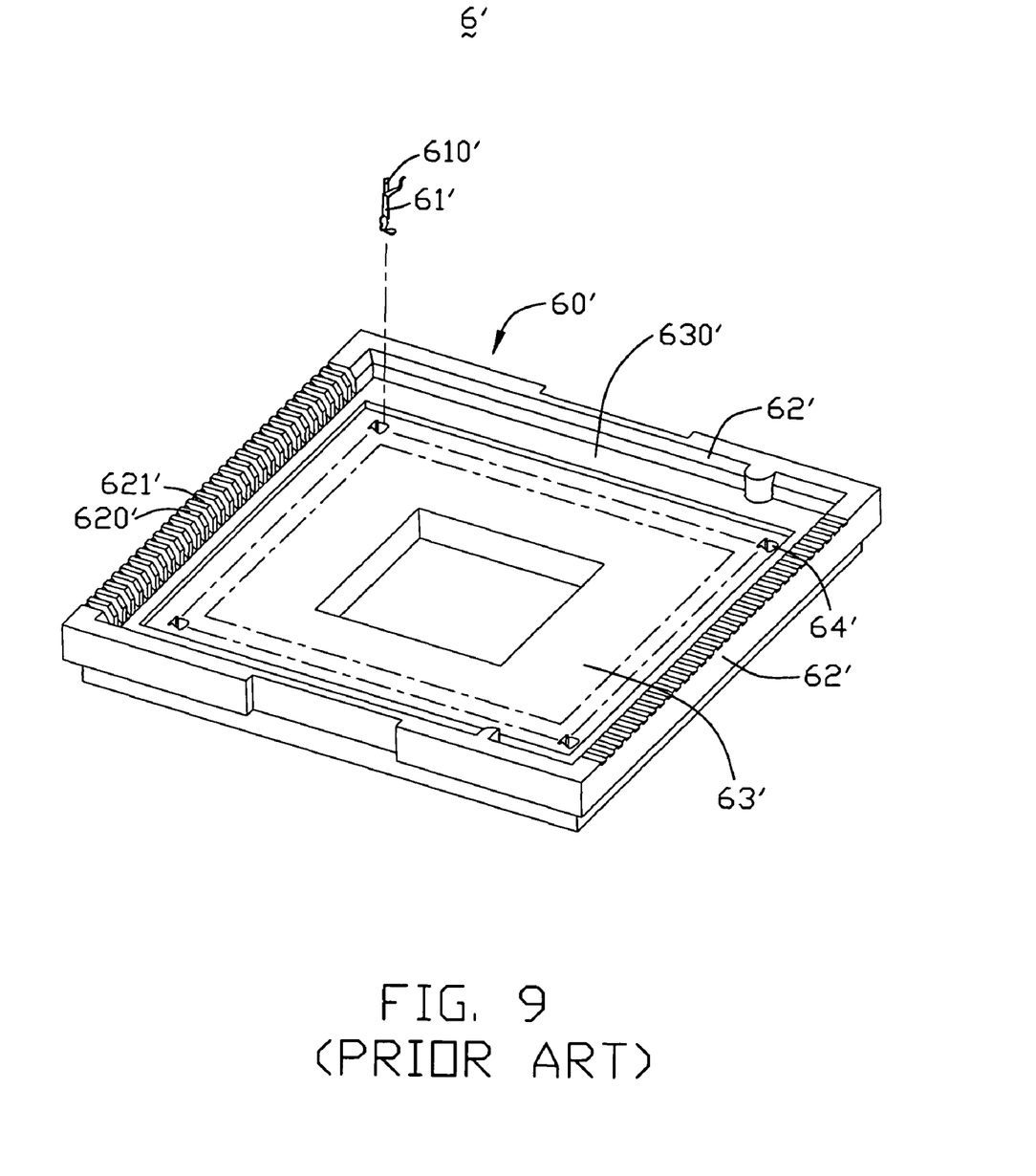
FIG. 9 is a simplified, exploded isometric view of another conventional LGA electrical connector.

FIG. 9 shows another conventional LGA connector 6' devised to overcome the above-described problem. The LGA connector 6' comprises a housing 60' and a multiplicity of terminals 61' received therein. A carrier strip (not shown) comprises a row of the terminals 61', and a row of connecting sections 610' respectively connecting the terminals 61' with a main body of the carrier strip. The housing 60' comprises a flat base 63' and four raised sides 62' surrounding the base 63'. Four raised portions 630' are disposed upwardly around the base 63'. The base 63' defines a square central cavity 631' therein, and a multiplicity of terminal passageways 64' regularly arranged in a generally rectangular array for interferentially receiving corresponding terminals 61' therein. Two opposite of the sides 62' each define a multiplicity of evenly spaced recesses 621' therein, thereby forming a multiplicity of evenly spaced projections 620'. Each recess 621' is bounded at a bottom thereof by a sloped surface of the sidewall 62', such that an inner portion of the recess 621' is disposed lower than an outer portion thereof. Accordingly, a side elevation cross section of each projection 620' is trapezium-shaped. When terminals 61' are installed near the projections 620', a common carrier strip connecting the terminals 61' is bent down so that connecting sections 610' of the carrier strip are received in corresponding recesses 621'. Junction portions between the terminals 61' and their respective connecting sections 610' are cut, and a main body of the carrier strip having the connecting sections 610' is removed. The recesses 621' enable the carrier strip to be manipulated so that sufficient space is made available for cutting off of the connecting sections 610' without interfering with the sidewall 62' thereat. The projections 620' and the four raised portions 630' provide precise fitting positioning of the LGA chip therebetween and thereon. However, when a force is exerted down on the LGA chip to make each pad (not shown) of the LGA chip engage with the terminal 61', the force is only supported by the four raised portions 630' around the base 63', which will make the middle portion of the LGA chip deformable downward. This can adversely affect the reliability of signal transmission between the terminals 61' and the LGA chip.

Therefore, a new LGA electrical connector which overcomes the above-mentioned problems is desired.

SUMMARY OF THE INVENTION

An object of the present invention is to provide an electrical connector for electrically connecting an electronic package such as an LGA chip with a circuit substrate such as a PCB, whereby the electrical connector having protrusions that minimize the risk of accidental damage to the associated electronic package.

Another object of the present invention is to provide an electrical connector having protrusions that securely lead terminals of the connector into true position engaging with the electronic package.

To achieve the above objects, an electrical connector in accordance with a preferred embodiment of the present invention is for connecting a land grid array (LGA) chip with a printed circuit board (PCB). The connector includes an insulative housing, and a plurality of terminals received in a plurality of passageways defined in the housing. The housing has a flat base and sidewalls extending upwardly from the base, the base and the sidewalls cooperatively defining a space therebetween for retaining the LGA chip therein. The base has a multiplicity of walls respectively between every two adjacent passageways along a length thereof, and four raised portions extending upwardly around the base. A multiplicity of protrusions is respectively extended upwardly from the walls. Two opposite of the sidewalls each define a multiplicity of evenly spaced recesses therein, thereby forming a multiplicity of evenly spaced projections.

When terminals are installed near the projections, a common carrier strip connecting the terminals is bent down so that connecting sections of the carrier strip are received in corresponding recesses. Junction portions between the terminals and their respective connecting sections are cut, and a main body of the carrier strip having the connecting sections is removed. The recesses enable the carrier strip to be manipulated so that sufficient space is made available for cutting off of the connecting sections without interfering with the sidewall thereat. The projections provide precise fitting positioning of the LGA chip in the space. In addition, when a force is exerted down on the LGA chip to make the LGA chip engage with the terminals, the protrusions and the four raised portions can support the force for separate the force without making the LGA chip deforming downwardly. Furthermore, when the force is exerted on the LGA chip to make the terminals engage with pads of the LGA chip, the protrusions can prevent the terminals moving from right-and-left for lead the terminals into true position connecting with the pads of the LGA chip. This ensures that engagement between the connector and the LGA chip is accurate and reliable.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
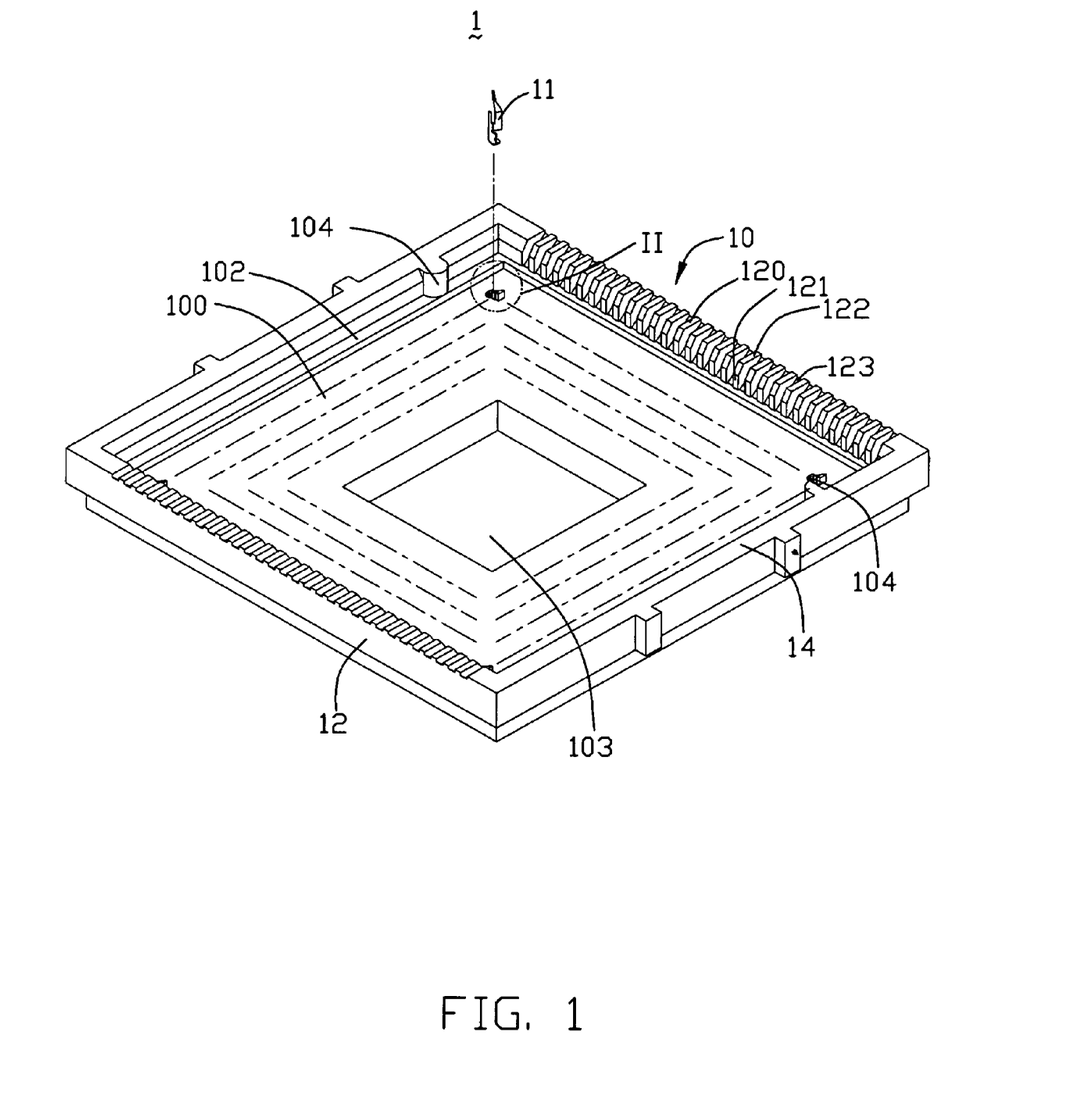
FIG. 1 is a simplified, exploded isometric view of an LGA electrical connector in accordance with a preferred embodiment of the present invention.
Figure 2:
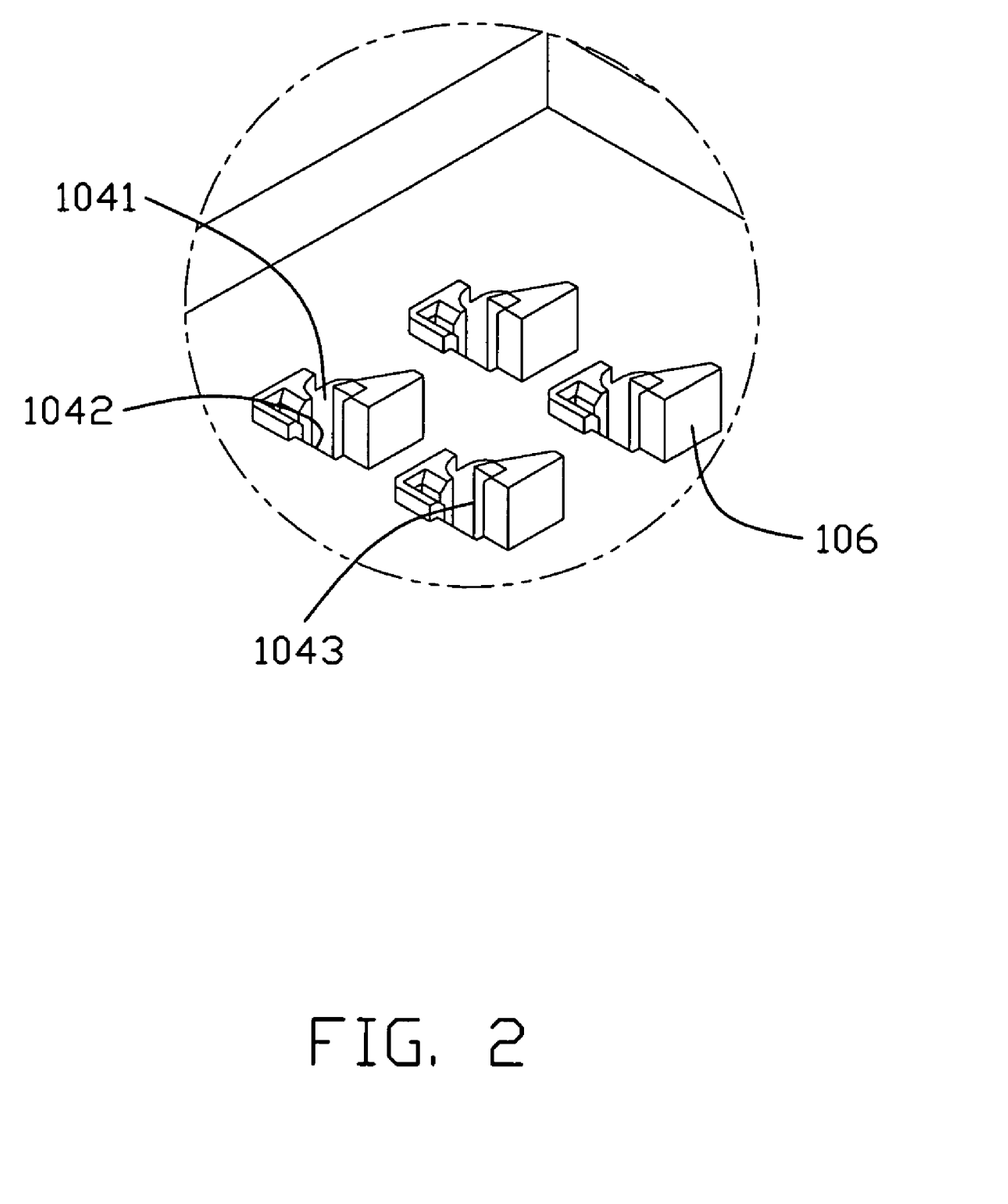
FIG. 2 is an enlarged view of a circled portion II of FIG. 1.
Figure 3:
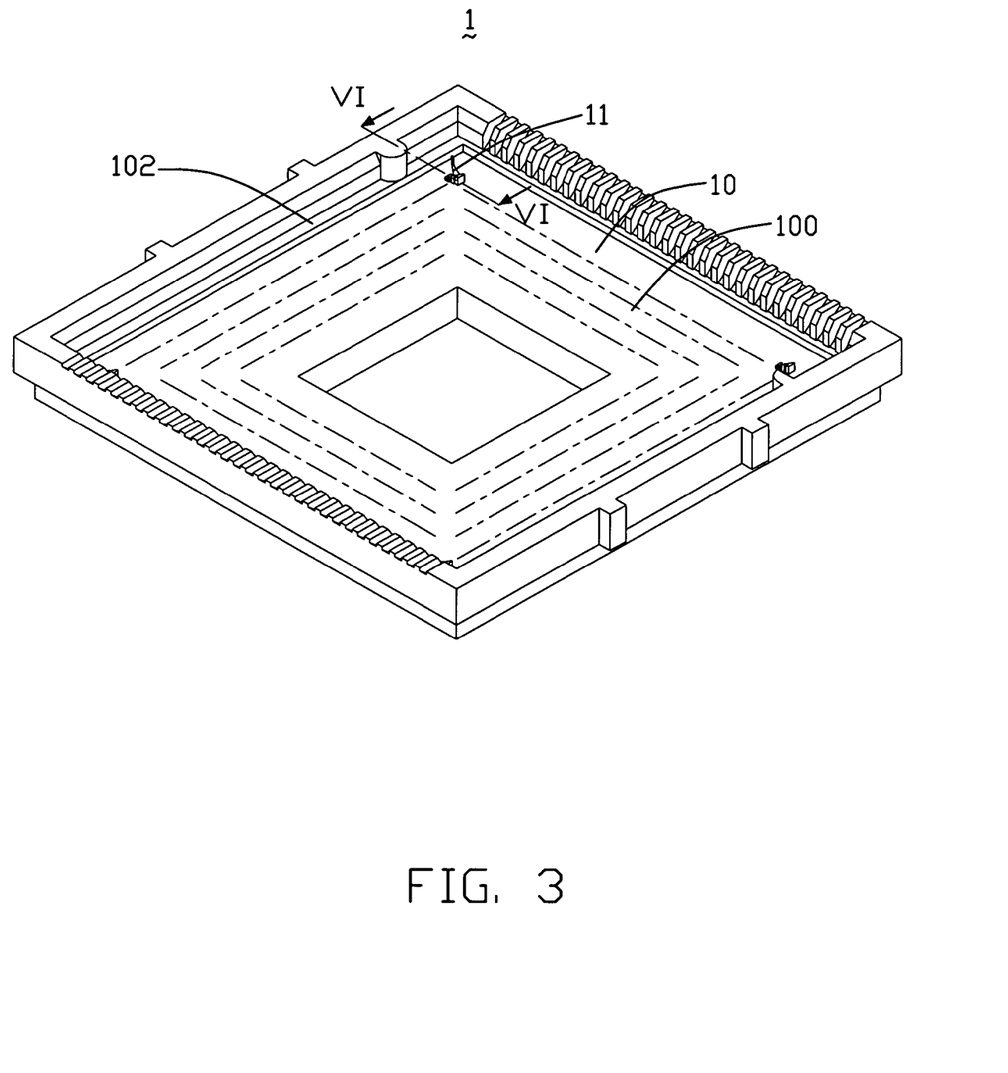
FIG. 3 is an assembled view of FIG. 1.
Figure 4:
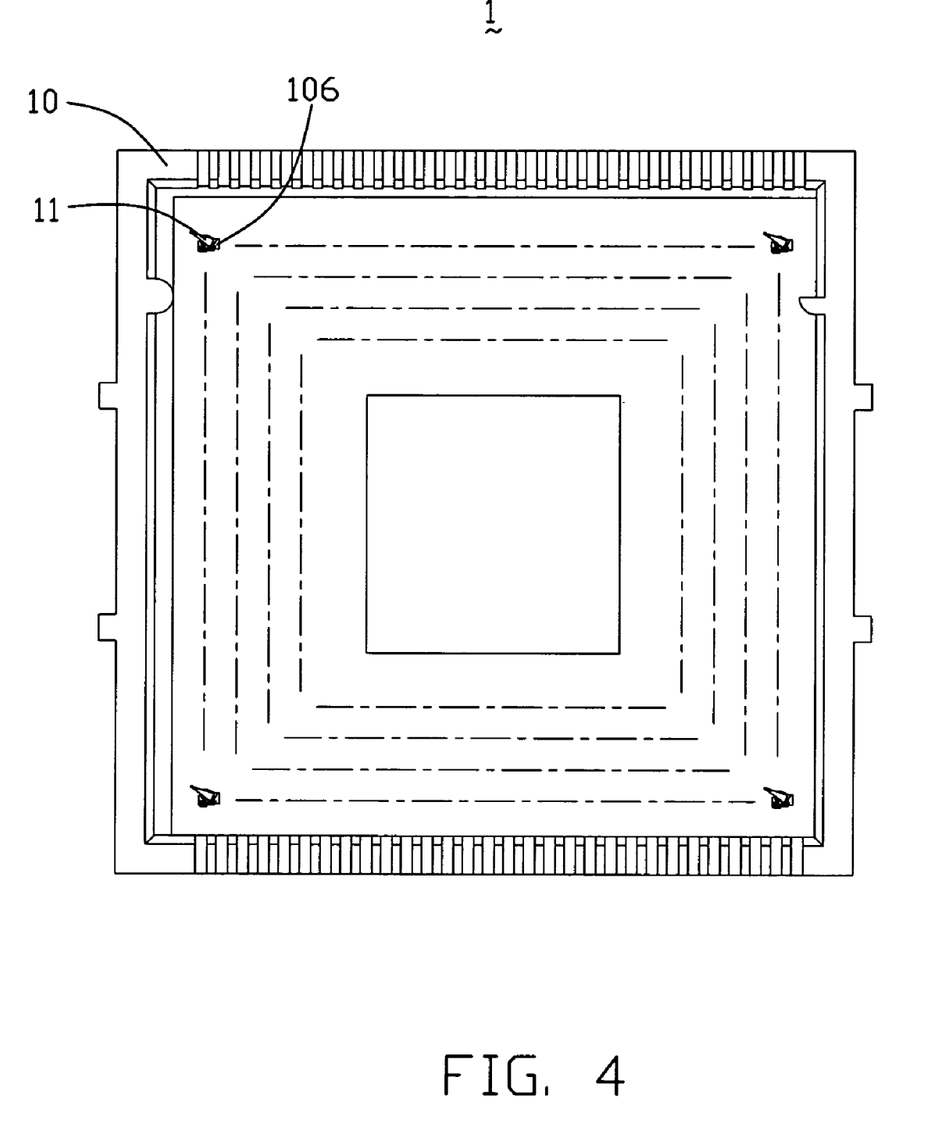
FIG. 4 is a top plan view of the connector.

Referring to FIGS. 1 and 2, an LGA electrical connector 1 in accordance with a preferred embodiment of the present invention is used for electrically connecting an electronic package such as a land grid array (LGA) central processing unit (CPU) 2 with a circuit substrate such as a printed circuit board (PCB) (not shown). The connector 1 comprises an insulative housing 10 and a multiplicity of terminals 11 received in the housing 10. A carrier strip (not shown) comprises a row of the terminals 11, and a row of connecting sections (not labelled) respectively connecting the terminals 11 with a main body of the carrier strip. The terminal 11 comprises a retaining portion 113 received in the housing 10, a spring arm 114 extending slantingly upwardly from a top end of the retaining portion 113. An arcuate contacting portion 111 is defined at a distal end of the spring arm 114, for resiliently electrically contacting a corresponding conductive pad 20 of the LGA chip 2 (see FIG. 6). A elbow 115 is formed in a middle portion of the spring arm 114.

The housing 10 is substantially rectangular. The housing 10 comprises two opposite first sidewalls 12, two opposite second sidewalls 14 interconnecting the first sidewalls 12, and a flat base 100 disposed between the first and second sidewalls 12, 14. The base 100 and first and second sidewalls 12, 14 cooperatively define a space therebetween for receiving the LGA chip 2 therein. The base 100 defines a square central cavity 103 therein, and a multiplicity of terminal passageways 104 regularly arranged in a generally rectangular array for interferentially receiving corresponding terminals 11 therein. The base 100 has a multiplicity of walls (not shown) respectively between every two adjacent passageways 104 along a length thereof, and four raised portions 102 extending upwardly around the base 100. A multiplicity of protrusions 106 is respectively extended upwardly from the walls. A side elevation cross section of each protrusion 106 is any shape, in the preferred embodiment, is trapezium-shaped. A height of the raised portion 102 is the same as that of the protrusion 106. A top surface of the protrusion 106 each is higher than the elbow 115 of the spring arm 114 of the terminal 11. When a force is exerted down on the LGA chip 2 to make pads 20 of the LGA chip 2 engage with the terminals 11, the force is supported by the protrusions 106 and the four raised portions 102.

The first sidewalls 12 each define a multiplicity of evenly spaced recesses 123 therein, thereby forming a multiplicity of evenly spaced projections 120. Each recess 123 is bounded at a bottom thereof by a sloped surface of the first sidewall 12, such that an inner portion of the recess 123 is disposed lower than an outer portion thereof. Accordingly, a side elevation cross section of each projection 120 is trapezium-shaped. The projection 120 comprises an inmost vertical first surface 121, a top second surface 122, and a chamfered surface between the first surface 121 and the second surface 122. Two blocks 140 are respectively formed on opposite inner faces of the second sidewalls 14. The LGA chip 2 can be guidably fixed between the blocks 140 and the first surfaces 121 of the first sidewalls 12.

Referring to FIGS. 3-6, in assembly of the LGA connector 1, firstly the housing 10 is molded. The carrier strip is positioned above the base 100 of the housing 10, parallel and close to the first surfaces 121 of the projections 120 of one first sidewall 12. The carrier strip is moved downwardly, so that the terminals 11 are received into corresponding terminal passageways 104 of the housing 10. The connecting sections of the carrier strip are located above the passageways 104, parallel to the first surfaces 121 of the projections 120 and opposite corresponding recesses 123 of the first sidewall 12. The carrier strip is bent down toward the first sidewall 12, so that the connecting sections of the carrier strip are received in the corresponding recesses 123. Junction portions between the terminals 11 and their respective connecting sections are cut, and the main body of the carrier strip having the connecting sections is removed. The above procedure is repeated as necessary for one or more other carrier strips at either or both of the first sidewalls 12. Thus, assembly of the LGA connector 1 is completed. The recesses 123 enable the carrier strip to be manipulated so that sufficient space is made available for cutting off of the connecting sections without interfering with the first sidewall 12.

Figure 5:
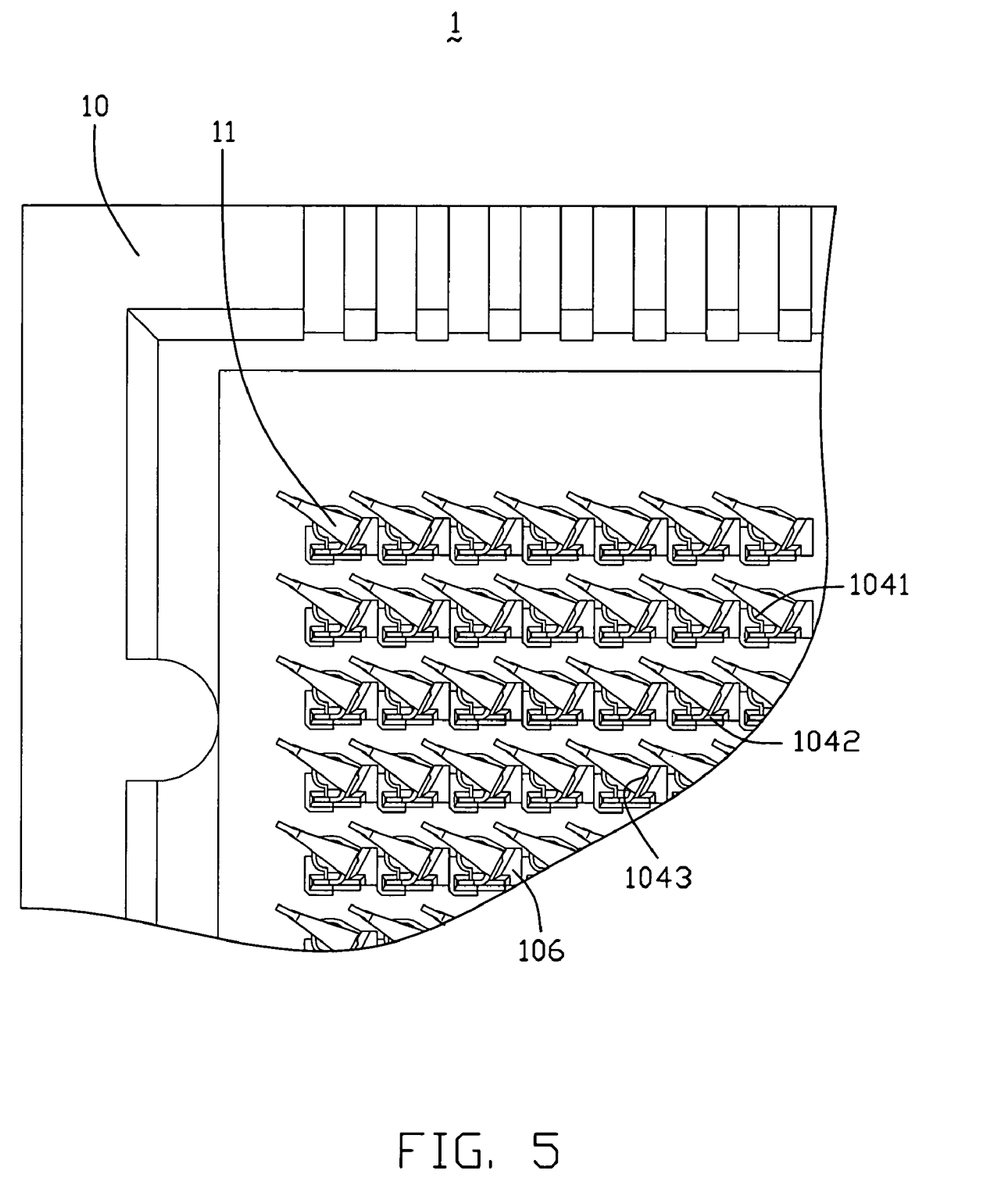
FIG. 5 is a partial enlarged view of FIG. 4.
Figure 6:
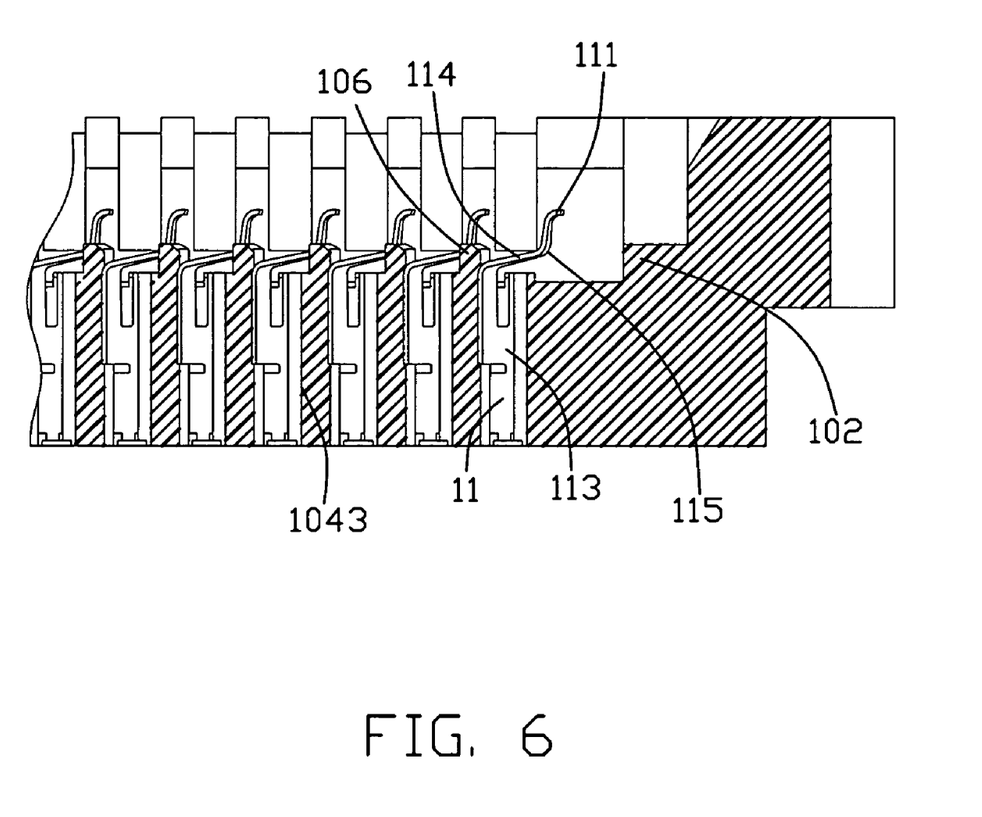
FIG. 6 is a cross-sectional view taken along line VI-VI of FIG. 3.
Figure 7:
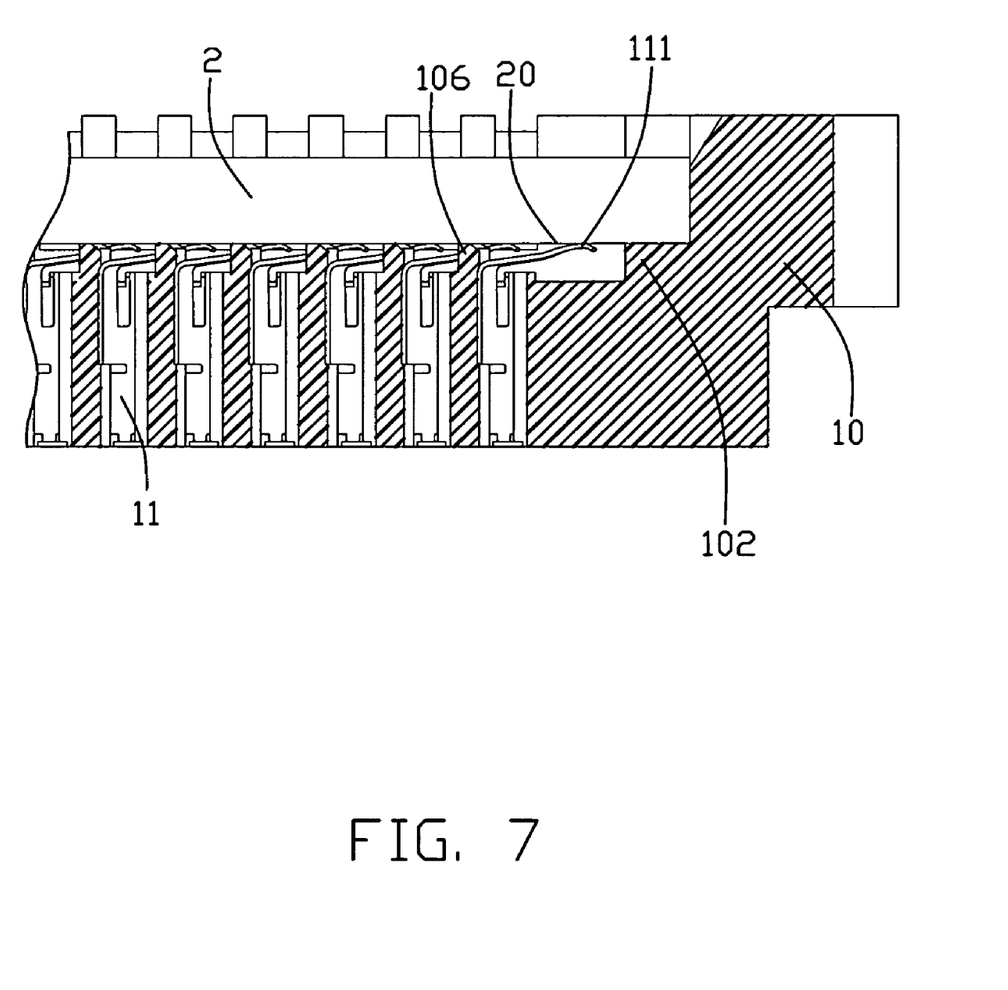
FIG. 7 is similar to FIG. 6, but shown an LGA chip mounted onto the connector.

Referring to FIGS. 5-7, when a force is exerted down on the LGA chip 2 to make each pad 20 of the LGA chip 2 engage with the contacting portion 111 of the corresponding terminal 11, the force is supported and separated by the four raised portions 102 and the protrusions 106 of the walls to protect the LGA chip 2 from distortion or damage should it sustain unduly large force. This can ensure that engagement between the connector 1 and the LGA chip 2 is accurate and reliable. In addition, because the protrusion 106 is extended upwardly from the wall, the elbow 115 of the spring arm 114 of the terminal 11 is lower than the top surface of the protrusion 106, when the force is exerted on the LGA chip 2 to make the spring arm 114 deform downwardly, two adjacent protrusions 106 can prevent the spring arm 114 from moving right-and-left and lead the contacting portion 111 into true position connecting with the pad 20 of the LGA chip 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for connecting an electronic package with a circuit substrate, comprising:
    an insulative housing having a base with a space for receiving the electronic package therein, the base defining a plurality of passageways arranged in rows and columns, and the insulative housing defining a beeline which extends from one passageway toward another passageway in an adjacent row and alternate column with respect to the corresponding row and column where the one passageway is located;
    a plurality of conductive terminals received in the corresponding passageways, each terminal including a spring arm arranged angularly with respect to the row, and substantially extending along an extending direction defined by the beeline, so the spring arm of one terminal received in said one passageway is in a same beeline with another spring arm of another terminal received in the another passageway located in the adjacent row and the alternate column.

2. The electrical connector as claimed in claim 1, wherein the terminal comprises a retaining portion received in the housing, the spring arm extends slantingly upwardly from a top end of the retaining portion, and an elbow is formed in a middle portion of the spring arm.

3. The electrical connector as claimed in one of claim 2, wherein the insulative housing has a bottom surface, which forms a plurality of protrusions thereon around the corresponding passageways, respectively, for upwardly facing the electronic package.

4. The electrical connector as claimed in claim 1, wherein said rows and said columns are arranged perpendicular to each other, and the passageway in one row directly neighbors, along the same row, with the passageway in the adjacent column rather than an alternate column.

5. The electrical connector as claimed in claim 1, wherein said direction is around 30 degrees relative to the row.

6. A connector socket, comprising:
    an insulative housing defining a plurality of passageways arranged in a matrix configured by at least first and second rows, each row including at least a first, a second and a third neighboring passageways sequentially;
    the first and second rows oriented to a row direction;
    a first, a second and a third terminals each received into the first, the second and the third passageways of the first row, respectively, and the first, the second and the third terminals including a first, a second and a third mating arms directed a first contact direction which is angled to the row direction, respectively;
    a fourth, a fifth and a sixth terminals each received into the first, the second and the third passageways of the second row, and the fourth, the fifth and the sixth terminals including a fourth, a fifth and a sixth mating arms directed a second contact direction which is angled to the row direction, respectively; wherein
    in a top view the second mating arm of the second contact of the first row extends along a first oblique line between a second oblique line defined by the first mating arm of the first terminal of the first row and a third oblique line defined by the fourth mating arm of the fourth terminal of the second row, while the third mating arm of the third terminal of the first row essentially extends along the third oblique line.

7. The connector socket as claimed in claim 6, wherein tips of said first, second and third terminals are aligned with each other in a direction defined by said rows and located around a centerline between the first row and the second row.

8. The connector socket as claimed in claim 6, wherein said first contact direction is same with the second contact direction.

9. The connector socket as claimed in claim 8, wherein said first oblique line, the second oblique line and the third oblique line extend along said first contact direction and said second contact direction.

10. An electrical connector for connecting an electronic package with a circuit substrate, comprising:
    an insulative housing having a base with a space for receiving the electronic package therein, the base defining a plurality of passageways arranged in rows and columns; and
    a plurality of conductive terminals, each received in the corresponding passageway and defining an engaging arm including a contacting portion extending away from the engaging arm for engagement with the electronic package; wherein
    in a top view a direction of the engaging arm is oblique with respect to the rows and the columns such that the engaging arm does not overlap any adjacent engaging arm in a vertical direction, wherein
    said direction of the engaging arm in said top view is around 30 degrees relative the row; wherein
    in the top view, in each of said terminals the engaging arm extends in a first oblique extension line and the contacting portion extends in a second oblique extension line perpendicular to said extension line under condition that the two terminals having the corresponding engaging arms essentially aligned with each other in a same first oblique extension line, are spaced from each other in a direction along said first oblique extension line with more than one second oblique extension lines defined by the corresponding contacting portions between the two corresponding contacting portions of said two terminals.

11. The electrical connector as claimed in one of claim 10, wherein the insulative housing has a bottom surface, which forms a plurality of protrusions thereon around the corresponding passageways, respectively, for upwardly facing the electronic package.

12. The electrical connector as claimed in claim 10, wherein the contacting portion is located outside of the corresponding passageway in said top view, and essentially vertically located above a position which is offset from the corresponding row where the corresponding passageway is located, rather than another position which is aligned with said corresponding row.

13. The electrical connector as claimed in claim 10, wherein said rows and said columns are arranged perpendicular to each other, and the passageway in one row directly neighbors, along the same row, with the passageway in the adjacent column rather than an alternate column.

* * * * *